United States Patent
Ayraud et al.

(10) Patent No.: US 10,524,209 B2
(45) Date of Patent: Dec. 31, 2019

(54) LOW POWER LOCAL OSCILLATOR

(71) Applicants: STMicroelectronics (Alps) SAS, Grenoble (FR); STMicroelectronics (Grenoble 2) SAS, Grenoble (FR)

(72) Inventors: Michel Ayraud, Voreppe (FR); Serge Ramet, Jarrie (FR); Philippe Level, Saint Egrève (FR)

(73) Assignees: STMicroelectronics (Grenoble 2) SAS, Grenoble (FR); STMicroelectronics (Alps) SAS, Grenoble (FR)

(*) Notice: Subject to any disclaimer, the term of this patent is extended or adjusted under 35 U.S.C. 154(b) by 0 days.

(21) Appl. No.: 15/692,012

(22) Filed: Aug. 31, 2017

(65) Prior Publication Data

US 2018/0270762 A1 Sep. 20, 2018

(30) Foreign Application Priority Data

Mar. 14, 2017 (FR) .................................. 17 52076

(51) Int. Cl.
| | |
|---|---|
| H04B 1/40 | (2015.01) |
| H04W 52/02 | (2009.01) |
| H03B 5/12 | (2006.01) |
| H04B 17/327 | (2015.01) |
| H03B 21/02 | (2006.01) |
| H03D 7/16 | (2006.01) |
| H03G 3/30 | (2006.01) |
| H04B 1/16 | (2006.01) |

(52) U.S. Cl.
CPC ...... *H04W 52/0274* (2013.01); *H03B 5/1212* (2013.01); *H03B 5/1278* (2013.01); *H03B 21/025* (2013.01); *H03D 7/166* (2013.01); *H03G 3/3052* (2013.01); *H04B 1/16* (2013.01); *H04B 17/327* (2015.01); *Y02D 70/00* (2018.01)

(58) Field of Classification Search
CPC .......................... H04W 52/0274; H04B 17/327
USPC ........................................................... 455/86
See application file for complete search history.

(56) References Cited

U.S. PATENT DOCUMENTS

| | | | | |
|---|---|---|---|---|
| 5,060,299 A | * | 10/1991 | Enderson | H03D 7/1408 455/326 |
| 5,299,264 A | * | 3/1994 | Schotz | H04B 1/04 381/14 |
| 5,497,128 A | * | 3/1996 | Sasaki | H03B 21/025 331/38 |
| 5,942,835 A | * | 8/1999 | Furuhashi | H02M 3/33507 310/316.01 |

(Continued)

FOREIGN PATENT DOCUMENTS

| | | |
|---|---|---|
| CN | 101795144 A | 8/2010 |
| CN | 207603629 U | 7/2018 |
| GB | 2497137 A | 6/2013 |

*Primary Examiner* — April G Gonzales
(74) *Attorney, Agent, or Firm* — Slater Matsil, LLP (57) ABSTRACT

A local oscillator device includes an oscillator module including a first inductive element and a capacitive element coupled in parallel with the inductive element. A frequency divider is coupled to the oscillator module for delivering a local oscillator signal. The local oscillator device includes an autotransformer including the first inductive element and two second inductive elements respectively coupled to the terminals of the first inductive element and to two output terminals of the autotransformer, the output terminals being further coupled to input terminals of the frequency divider.

25 Claims, 4 Drawing Sheets

(56) References Cited

U.S. PATENT DOCUMENTS

| | | | | |
|---|---|---|---|---|
| 6,259,997 B1* | 7/2001 | Sasho | ............. | H04B 17/327 |
| | | | | 702/60 |
| 6,621,365 B1* | 9/2003 | Hallivuori | ............. | H03J 5/244 |
| | | | | 331/117 FE |
| 6,946,924 B2* | 9/2005 | Chominski | ......... | H03B 5/1231 |
| | | | | 331/117 R |
| 7,123,117 B2* | 10/2006 | Chen | ............. | H01F 17/00 |
| | | | | 333/177 |
| 7,268,630 B2* | 9/2007 | Rhee | ............. | H03L 7/0898 |
| | | | | 331/117 R |
| 7,391,272 B2* | 6/2008 | Fujita | ............. | H03L 1/026 |
| | | | | 331/167 |
| 8,044,733 B1* | 10/2011 | Arora | ............. | H03B 5/1243 |
| | | | | 331/117 FE |
| 8,183,948 B2* | 5/2012 | Ainspan | ............. | H03L 7/099 |
| | | | | 331/117 FE |
| 8,319,564 B2* | 11/2012 | Ding | ............. | H03B 5/1212 |
| | | | | 331/49 |
| 8,773,215 B2* | 7/2014 | Sadhu | ............. | H03B 5/1228 |
| | | | | 331/117 FE |
| 8,779,865 B2* | 7/2014 | Ainspan | ............. | H03L 7/099 |
| | | | | 331/117 FE |
| 8,836,443 B2* | 9/2014 | Ding | ............. | H03B 5/1212 |
| | | | | 331/181 |
| 8,880,018 B2* | 11/2014 | Rafi | ............. | H03D 7/00 |
| | | | | 375/345 |
| 9,071,193 B1* | 6/2015 | Caviglia | ............. | H03B 5/1228 |
| 9,106,179 B2* | 8/2015 | Trivedi | ............. | H03B 5/1228 |
| 9,559,667 B1* | 1/2017 | Chakrabarti | ............. | H03K 3/013 |
| 9,780,725 B2* | 10/2017 | Chakrabarti | ............. | H03K 3/013 |
| 9,831,830 B2* | 11/2017 | Valdes Garcia | ..... | H03B 5/1265 |
| 2009/0232259 A1* | 9/2009 | Fujii | ............. | H03L 7/193 |
| | | | | 375/344 |
| 2009/0251177 A1* | 10/2009 | Jang | ............. | H03B 19/14 |
| | | | | 327/118 |
| 2009/0325510 A1* | 12/2009 | Pullela | ............. | H03D 7/1441 |
| | | | | 455/76 |
| 2010/0225407 A1* | 9/2010 | Goyal | ............. | H03B 19/00 |
| | | | | 331/117 FE |
| 2011/0014880 A1* | 1/2011 | Nicolson | ............. | G01S 7/032 |
| | | | | 455/86 |
| 2011/0158356 A1* | 6/2011 | Hsieh | ............. | H04B 17/327 |
| | | | | 375/340 |
| 2012/0046007 A1* | 2/2012 | Rafi | ............. | H03D 7/00 |
| | | | | 455/209 |
| 2012/0214434 A1* | 8/2012 | Otaka | ............. | H03L 7/0802 |
| | | | | 455/141 |
| 2014/0009236 A1* | 1/2014 | Choi | ............. | H03B 5/1228 |
| | | | | 331/117 FE |
| 2014/0030991 A1* | 1/2014 | Liu | ............. | H04W 52/0274 |
| | | | | 455/115.3 |
| 2014/0038542 A1* | 2/2014 | Rafi | ............. | H03D 7/00 |
| | | | | 455/326 |
| 2015/0180414 A1* | 6/2015 | Lee | ............. | H03B 7/06 |
| | | | | 327/157 |
| 2015/0214891 A1* | 7/2015 | Shi | ............. | H03B 5/1206 |
| | | | | 331/117 R |
| 2016/0072443 A1* | 3/2016 | Mizokami | ............. | H03F 1/565 |
| | | | | 330/295 |
| 2016/0099681 A1* | 4/2016 | Zong | ............. | H03B 5/1215 |
| | | | | 331/117 FE |
| 2016/0204813 A1* | 7/2016 | Mu | ............. | H04B 1/06 |
| | | | | 455/343.1 |

* cited by examiner

LOW POWER LOCAL OSCILLATOR

CROSS-REFERENCE TO RELATED APPLICATIONS

This application claims priority to French Patent Application No. 1752076, filed on Mar. 14, 2017, which application is hereby incorporated herein by reference.

TECHNICAL FIELD

Embodiments of the invention relate generally to integrated circuits, and in particular embodiments, to low power consumption oscillators, e.g., in transceiver systems.

BACKGROUND

Transceiver systems generally comprise local oscillators for generating local oscillator signals at useful frequencies, e.g. of the order of a gigahertz, notably allowing frequency transpositions to be performed.

Figure 1:
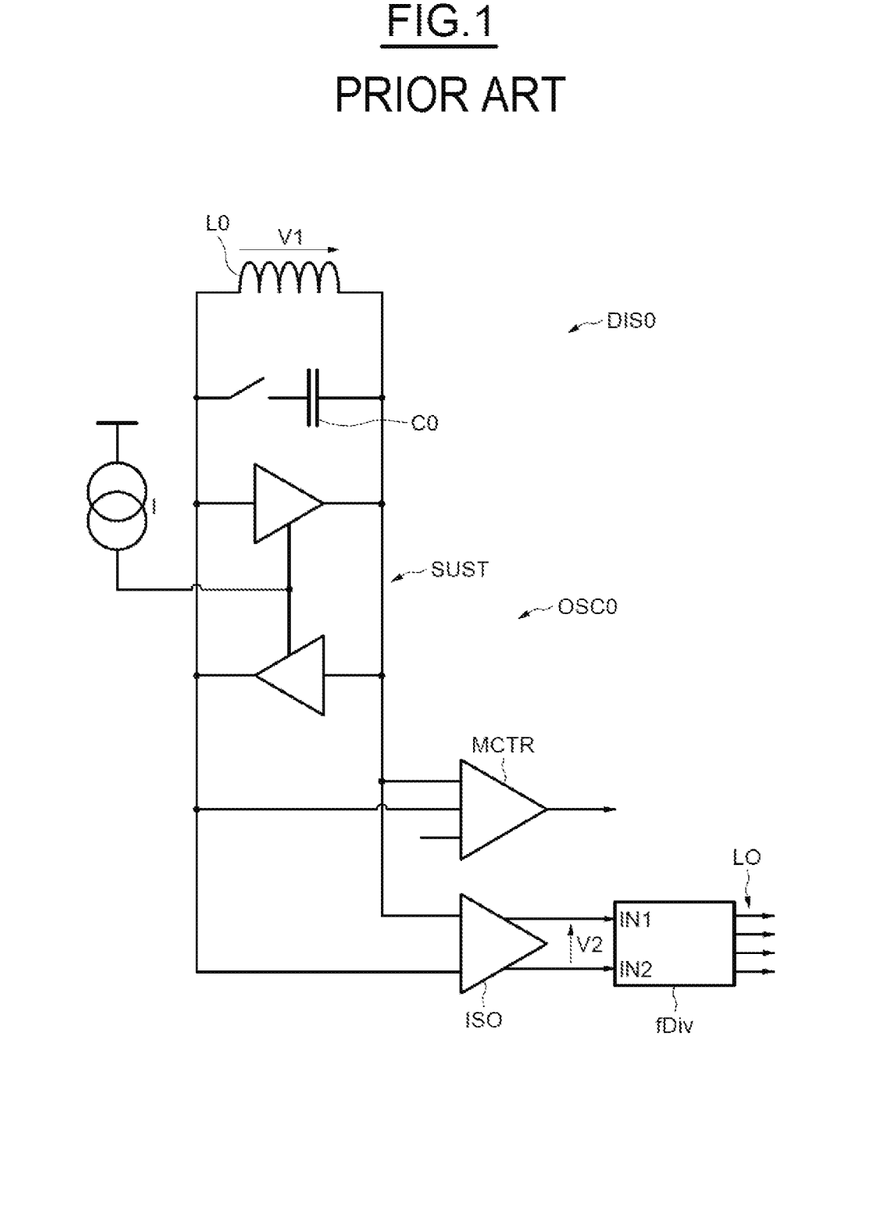
FIG. 1, described previously, represents a conventional local oscillator.

FIG. 1 represents an example of a common local oscillator DISo.

The local oscillator DISo comprises an oscillator module OSCo, in which an inductive element Lo and a capacitive element Co mounted in parallel form a conventional LC resonator known per se, generating an oscillating signal V1 at the terminals of the inductive element Lo.

The elements Lo and Co of such an oscillator module OSCo are usually selected to satisfy a compromise notably between phase noise, energy consumption and surface area occupied.

A sustaining amplifier SUST, supplied by a current source I, allows the oscillations of the signal V1 to be maintained by compensating resistive losses.

Such a setup offers good performance in terms of phase noise, energy consumption and surface area occupied by the circuit.

A frequency divider fDiv divides the frequency of the oscillating signal present on the inductive element Lo in order that the LC resonator can be configured for generating an oscillating signal V1 at a higher frequency. Indeed, this makes it possible to reduce the surface area occupied by the inductive element Lo and to reduce the coupling between the oscillator OSCo and the output signal of the divider fDiv or an amplified version of this signal, since the fundamental frequencies of the signals delivered by OSCo and fDiv are different.

The local oscillator signal LO is delivered at the output of the frequency divider fDiv, generally in the form of a square-wave voltage.

To produce such a signal the frequency divider fDiv must receive at its input a signal the amplitude of which is significantly above the thresholds of the transistors that it comprises.

However, high amplitude signals accentuate the "varactor" effect on the transistors of the input stage of fDiv, i.e. the variation in the capacitive component of their input impedance, which results in adding phase noise at the oscillator OSCo. More broadly this effect also occurs on all the other components connected to the LC resonator, such as the sustaining amplifier SUST and the amplitude controller MCTR. Thus, such local oscillators DISo are usually provided with a buffer amplifier ISO used both to isolate the LC resonator from the frequency divider fDiv inputs, and to generate an amplified signal V2 of sufficient amplitude for the input requirements of the frequency divider fDiv, from the oscillating signal V1.

Indeed, the capacitive value at the inputs of the buffer amplifier ISO is sufficiently small and sufficiently insensitive to the "varactor" effect not to interfere with the LC resonator.

On the other hand, this type of buffer amplifier ISO has the drawback of having a variable gain with many factors, such as temperature, the frequency of the signal at its input, or the vagaries of manufacture. Furthermore, this type of buffer amplifier ISO tends to degrade the duty cycle of the signal at its input (i.e., the ratio between the time at the high state and the period of the signal).

SUMMARY

Accordingly, a usual solution consists in over-dimensioning the buffer amplifier ISO so that it is less sensitive to these factors. Over-dimensioning the buffer amplifier ISO, however, may create undesirable excessive energy consumption.

Accordingly, embodiments of the invention limit the energy consumption of this type of local oscillator without reducing its performance.

Thus, according to one aspect, a local oscillator device is provided comprising an oscillator module with a first inductive element and a capacitive element mounted in parallel, and a frequency divider coupled to the oscillator module for delivering a local oscillator signal.

According to a general feature of this aspect, the local oscillator device comprises an autotransformer including the first inductive element and two second inductive elements respectively coupled to the terminals of the first inductive element and to two output terminals of the autotransformer, the output terminals being further coupled to input terminals of the frequency divider.

It is recalled here that an autotransformer is a transformer in which the primary and secondary circuits have a common part.

Thus, the two second inductive elements of the autotransformer supply an increased amplitude oscillation sufficient to meet the aforementioned requirements at the input of the frequency divider.

This overcomes the need for the buffer amplifier while maintaining a low oscillation level in the oscillator module, a suitable phase noise and an unchanged occupied surface area.

Furthermore, the autotransformer makes it possible to obtain a new degree of freedom in the architecture of the integrated circuit by placing the output terminals at a location other than the terminals of the first inductive element.

For example, the terminals of the first inductive element are located on a first side of the periphery of the autotransformer, and the output terminals are each located on another side of the periphery of the autotransformer.

Advantageously, the output terminals are located on a second side of the periphery of the autotransformer opposite the first side with respect to a central point of the autotransformer.

The central point of the autotransformer may be, for example, a geometric center, such as a center of symmetry of the autotransformer.

This allows placing the output terminals of the transformer at a more convenient place for connection to the input of the frequency divider, and thus saves space. Furthermore, this makes it possible to avoid a degradation in the quality factor of the oscillator module usually introduced by numerous and lengthy conductive tracks coupled to its terminals.

According to one embodiment in which the first inductive element comprises a first flat conductive track having an interlaced coil shape, and the second inductive elements each comprise a second flat conductive track having a coil shape, the second conductive tracks being interlaced with each other and located on the periphery of the first inductive element, the ratio of the width of the second conductive tracks over the width of the first conductive track is advantageously between 0.1 and 0.7.

Indeed, the second inductive elements may comprise narrower tracks than those of the first inductive element without restricting the quality factor of the oscillator module, notably since the power delivered on the output terminals is low compared to the power necessary for the oscillator module.

Accordingly, the surface area initially occupied by a first inductive element alone is substantially unchanged here.

According to one embodiment in which the frequency divider is configured for dividing the frequency of a signal having an amplitude above a threshold amplitude, the oscillator module is configured for generating an oscillating signal with an amplitude below the threshold amplitude on the terminals of the first inductive element, and the autotransformer is configured for generating an amplified signal of the oscillating signal on the output terminals with an amplitude above the threshold amplitude.

The local oscillator device is advantageously implemented in an integrated manner within an integrated circuit.

A transceiver system, including an antenna intended to transmit and receive radio frequency signals, a transmitting chain, and a receiving chain coupled to the antenna, advantageously comprises a local oscillator device as defined above coupled to the transmitting and receiving chains.

An electronic apparatus, such as a mobile phone or a touch tablet, advantageously comprises such a transceiver system.

BRIEF DESCRIPTION OF THE DRAWINGS

Other advantages and features of the invention will appear on examination of the detailed description of embodiments, in no way restrictive, and the accompanying drawings in which.

DETAILED DESCRIPTION OF ILLUSTRATIVE EMBODIMENTS

Figure 2:
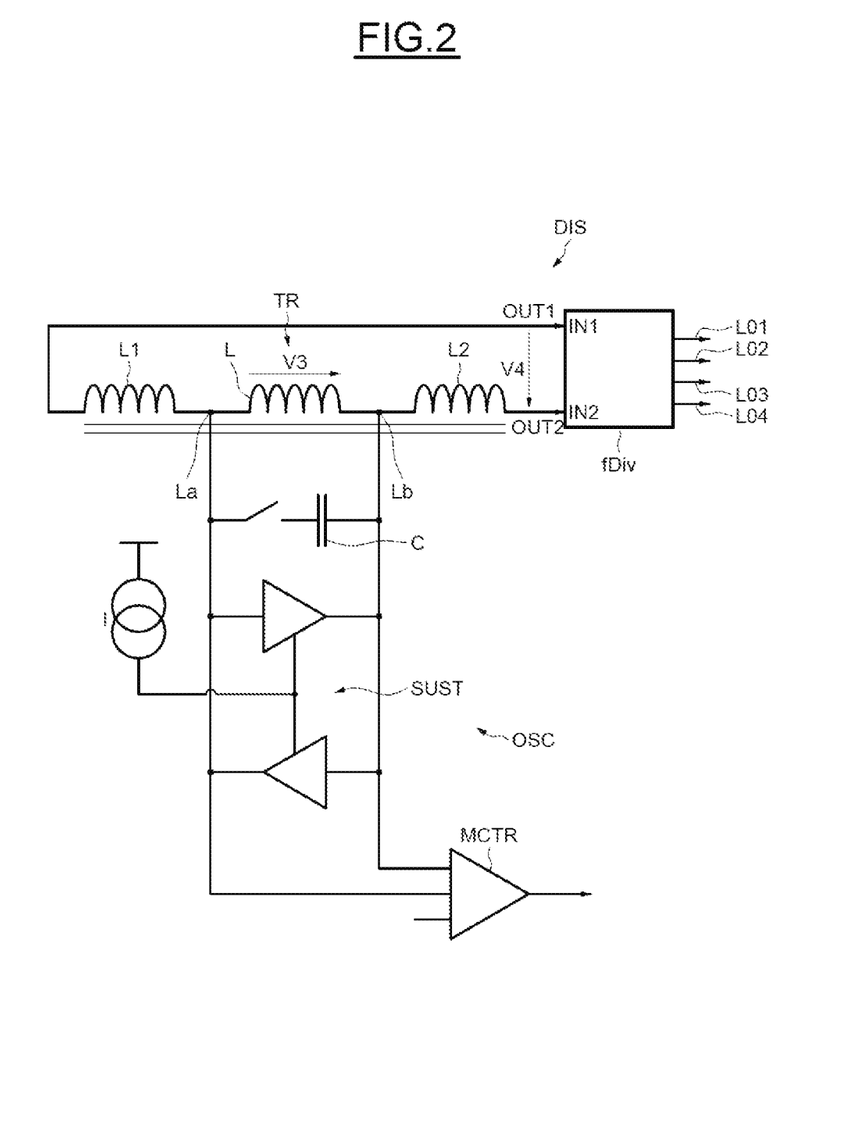
FIGS. 2 to 5 represent examples of embodiments of the invention.

FIG. 2 represents a local oscillator device DIS, implemented, for example, in an integrated manner within an integrated circuit.

The local oscillator device DIS comprises an oscillator module OSC including a first inductive element L and a capacitive element C mounted in parallel, of the LC resonator type.

The capacitive element C may, for example, comprise a bank of elementary capacitive elements in parallel, coupled or not coupled to the first inductive element L via controllable switches. This notably makes it possible to adjust the capacitive value of the capacitive element C.

The oscillator module OSC generates in the usual way an oscillating signal V3 on the terminals La and Lb of the first inductive element L. The amplitude of the oscillating signal V3 may, for example, be 0.5 volts.

The oscillator module OSC further comprises a sustaining amplifier SUST supplied by a current source I, and connected in parallel to the LC resonator. The sustaining amplifier SUST allows the oscillations of the signal V3 to be maintained by compensating resistive losses, and controlling the oscillation amplitude thanks to adjusting the current I via an amplitude controller MCTR.

The local oscillator device DIS comprises a frequency divider fDiv, configured in this example for communicating two local oscillator output signals LO1, LO3 in phase quadrature, and two local oscillator signals LO2, LO4 respectively in phase opposition with the signals in phase quadrature LO1, LO3.

The signals LO1-LO4 at the output of the frequency divider fDiv are at a frequency proportional to the frequency of the signal V4 present between the two inputs IN1, IN2 of the frequency divider fDiv.

For example, the frequency divider may divide the frequency of the signal V4 on its input by 2 or by 4.

The frequency divider fDiv, for example, implemented in CMOS technology, requires for its operation an input signal with an amplitude above a threshold amplitude.

This threshold amplitude stems notably from the threshold voltage necessary to engage a switching of a CMOS transistor, and must be, for example, greater than 1 volt. An autotransformer TR makes it possible to generate on its output terminals OUT1, OUT2, a signal V4 with an amplitude level above the threshold amplitude at the output of the frequency divider fDiv, from an oscillating signal V3 generated by the oscillator device OSC having an amplitude level below the threshold amplitude.

The autotransformer TR includes the first inductive element L as the primary circuit and a secondary circuit including two second inductive elements L1, L2. The second inductive elements L1, L2 are respectively coupled to the terminals La, Lb of the first inductive element L and to two output terminals OUT1, OUT2 of the autotransformer TR.

The output terminals OUT1, OUT2 of the autotransformer TR are directly coupled to the input terminals IN1, IN2 of the frequency divider fDiv, transmitting the signal V4 thereto.

Figure 3:
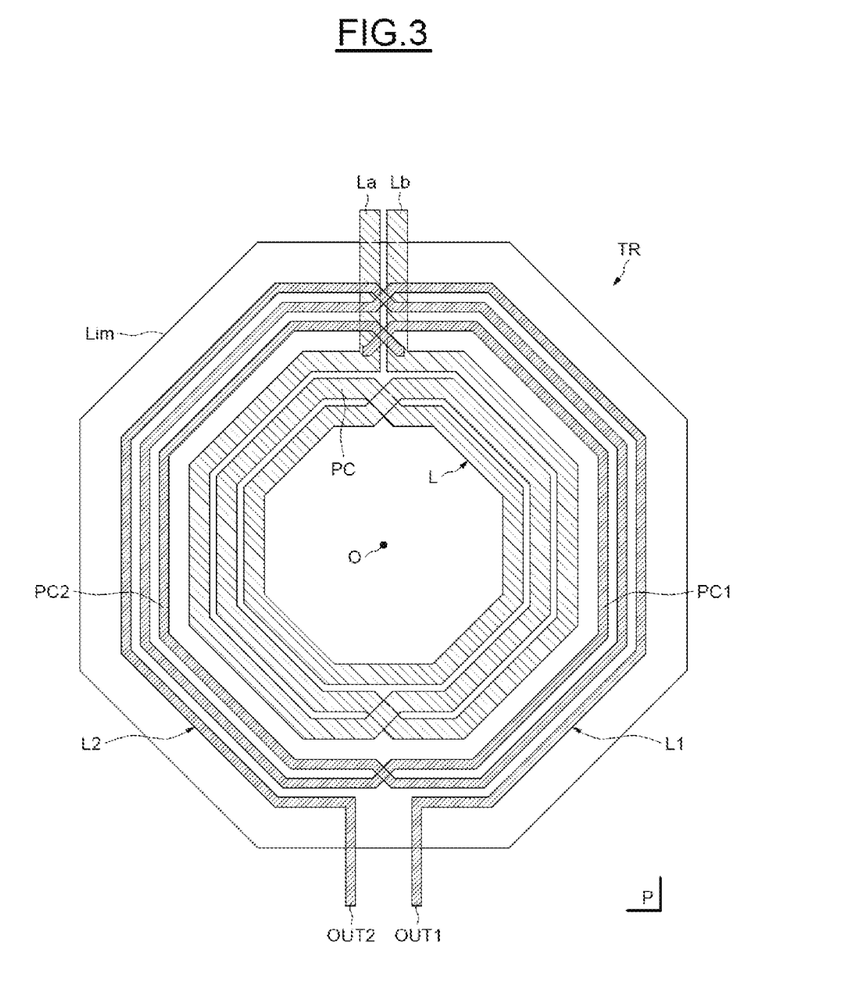

FIG. 3 represents an embodiment of an autotransformer TR advantageously integrated according to the invention into the device DIS described in relation to FIG. 2.

The autotransformer TR comprises the first inductive element L implemented by a first conductive track PC, e.g., made of metal and located in the first interconnection levels of an integrated circuit.

The autotransformer TR comprises two second inductive elements L1, L2, also implemented by second respective conductive tracks PC1, PC2, e.g., made of metal and located in the first interconnection levels of the integrated circuit.

In the description in relation to FIG. 3, the first inductive element L may be designated by the term primary circuit, and the second inductive elements L1, L2 by the term secondary circuit.

The conductive track PC of the primary circuit L is implemented in a plane P, and has an interlaced coil shape.

More precisely the conductive track PC, starting from the terminal La, follows a route having in its first half an octagonally-shaped coil that winds round in a first direction and then having in its second half an octagonally-shaped coil winding round in the same direction, in an interlaced manner with the winding of the coil of the first half of the route, up to the terminal Lb.

The conductive track PC comprises n coils (i.e., n convolutions), n being a whole number, with n=2 in the representation of FIG. 3.

The width of the metal track PC is, for example, between 10 μm and 20 μm.

The secondary circuit comprises two second conductive tracks PC1 and PC2 interlaced with each other and located on the periphery of the first inductive element L.

The first of these second conductive tracks PC1, is also implemented in the plane P and has an octagonally-shaped coil that winds round in the same first direction, starting from the terminal OUT1 up to the terminal La. The conductive track PC1 forms the first of the second inductive elements L1, coupled to the first inductive element L on its terminal La.

The second of these second conductive tracks PC2, is also implemented in the plane P and also has an octagonally-shaped coil that winds round in the first direction, starting from the terminal Lb up to the terminal OUT2, in an interlaced manner with the winding of the first second conductive track PC1. The conductive track PC2 forms the second of the second inductive elements L2, coupled to the first inductive element L on its terminal Lb.

The conductive tracks PC1, PC2 of the secondary circuit each comprise, for example, n/2 coils, n being the number of coils of the conductive track PC of the primary circuit.

Moreover, the conductive tracks PC1, PC2 of the secondary circuit may be narrower than the conductive track PC of the primary circuit, e.g., according to a width ratio between 0.1 and 0.7.

The autotransformer TR has an overall octagonal shape in the example represented in FIG. 3, but could have other forms, e.g. square or circular. A point O located in the middle of the autotransformer TR designates a central point. The central point O is substantially a point of symmetry of the autotransformer shape, at the positions of the terminals and nearby crossings.

The octagonal outline Lim defines an area of protection for the autotransformer TR inside which any signal other than that of the oscillator is excluded.

Thus, it is seen in FIG. 3 that the implementation of the second inductive elements L1, L2 of the autotransformer TR do not substantially occupy more surface area than the surface area occupied by the inductive element L alone.

Thus, via electromagnetic coupling of the autotransformer TR, the voltage V4 between the output terminals OUT1, OUT2 may be expressed as: V4=(½)*V3+V3+(½)*V3=2*V3, in this example with n coils in the primary circuit and n/2 coils in each inductive element L1, L2 of the secondary circuit.

The inductive elements L, L1, L2 of the autotransformer TR are dimensioned so that the signal V3 is optimized for the oscillator module OSC, e.g. with regard to phase noise and surface area occupation, and so that the signal V4 is of an amplitude at least equal to the threshold amplitude of the frequency divider fDiv.

Furthermore, in the example represented in FIG. 3, the terminals La, Lb of the first inductive element are located on a first side of the octagon, on the periphery of the autotransformer TR.

The output terminals OUT1, OUT2, are located on the side opposite this first side. The output terminals OUT1, OUT2 could be located on another side of the autotransformer TR, and not necessarily on the same side, notably according to the requirements regarding the number of coils and the architecture of the integrated circuit.

In such a configuration, it is possible to place the frequency divider fDiv on the side of the outputs OUT1, OUT2 of the autotransformer, which makes it possible to relieve the load congestion on the terminals La, Lb of the first inductive element, and to reduce the size of the electrical paths linking the oscillator module OSC notably to the inputs of the frequency divider fDiv.

Figure 4:
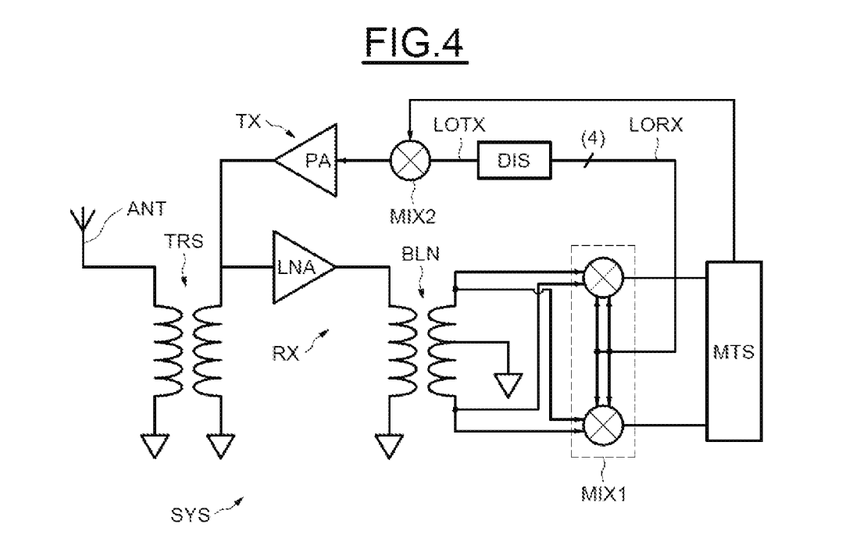

FIG. 4 represents a simplified example of a transceiver system SYS e.g. configured for communicating at frequencies of the order of a gigahertz, advantageously comprising a local oscillator device DIS as previously described in relation to FIGS. 2 and 3.

The transceiver system SYS includes a receiving stage RX and a transmitting stage TX.

The receiving stage RX conventionally comprises a low-noise amplifier LNA, transmitting the signal received by the antenna ANT to a symmetrical-asymmetrical transformer BLN ("balun" according to the usual term).

At the output of the balun transformer BLN, the signal is in differential mode, and each differential component of the signal is mixed by a mixer MIX1 with a local oscillator signal LORX supplied at the output of the frequency divider fDiv of the device DIS, which makes it possible to perform frequency transpositions, e.g., in baseband.

The transposed signals are then processed by processor MTS, e.g., partly implemented by software within a processor (a baseband processor, for example).

The transmitting stage TX comprises a power amplifier PA configured for generating a transmission signal amplified on the antenna ANT, the carrier frequency of which is the frequency of a local oscillator signal LOTX supplied at the output of the frequency divider fDiv of the device DIS.

The signal received at the input of the power amplifier PA results from a frequency transposition, in the radio frequency domain, of a signal emanating from the processor MTS, e.g., of the baseband processor, with the aid of the local oscillator signal LOTX.

Figure 5:
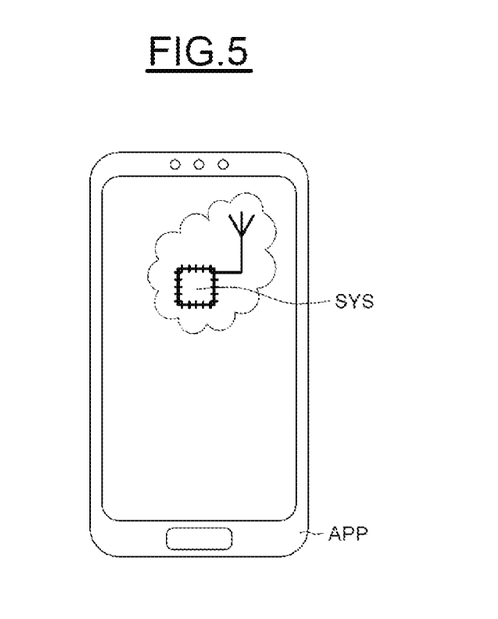

FIG. 5 represents an example of an electronic apparatus APP provided with an embodiment of a radio frequency communication system SYS as previously detailed, here a mobile phone. It will be clear to the person skilled in the art that the embodiments of a radio frequency communication system SYS or of a local oscillator device DIS according to the invention may be included in any other type of apparatus or other known system not described here.

Moreover, the invention is not limited to the embodiments that have been described above but embraces all the variants, e.g., the architecture of the autotransformer, the various components of the oscillator device or the radio frequency system that have been given by way of example.

What is claimed is:

1. A local oscillator device comprising:
   an oscillator module having a first inductive element and a capacitive element coupled in parallel with the first inductive element, wherein the first inductive element and the capacitive element form a resonator;
   a frequency divider coupled to the oscillator module and configured to deliver a local oscillator signal; and
   an autotransformer comprising the first inductive element, a second inductive element, and a third inductive element, a first terminal of the second inductive element DC coupled to a first terminal of the first inductive element, a second terminal of the second inductive element being a first output terminal of the autotransformer, a first terminal of the third inductive element DC coupled to a second terminal of the first inductive element, a second terminal of the third inductive element being a second output terminal of the autotransformer, the first output terminal and the second output terminal of the autotransformer being DC coupled to input terminals of the frequency divider.

2. The local oscillator device of claim 1, wherein the capacitive element comprises a plurality of capacitors coupled in parallel with the first inductive element.

3. The local oscillator device of claim 2, wherein at least one capacitor of the plurality of capacitors is coupled to the first inductive element via a controllable switch.

4. The local oscillator device of claim 1, further comprising:
a sustaining amplifier coupled in parallel with the first inductive element; and
a current source coupled to the sustaining amplifier.

5. The local oscillator device of claim 4, further comprising an amplitude controller coupled to the current source.

6. The local oscillator device of claim 1, wherein the first output terminal and the second output terminal of the autotransformer are each directly connected to a different input terminal of the frequency divider.

7. The local oscillator device of claim 1, wherein the first terminal and the second terminal of the first inductive element are located on a first side of a periphery of the autotransformer, and the first output terminal and the second output terminal of the autotransformer are each located on another side of the periphery of the autotransformer.

8. The local oscillator device of claim 7, wherein the first output terminal and the second output terminal of the autotransformer are located on a second side of the periphery of the autotransformer opposite the first side with respect to a central point of the autotransformer.

9. The local oscillator device of claim 1, wherein the autotransformer has an octagonal shape.

10. A local oscillator device comprising:
an oscillator module having a first inductive element and a capacitive element coupled in parallel with the first inductive element;
a frequency divider coupled to the oscillator module and configured to deliver a local oscillator signal; and
an autotransformer comprising the first inductive element, a second inductive element, and a third inductive element, a first terminal of the second inductive element DC coupled to a first terminal of the first inductive element, a second terminal of the second inductive element being a first output terminal of the autotransformer, a first terminal of the third inductive element DC coupled to a second terminal of the first inductive element, a second terminal of the third inductive element being a second output terminal of the autotransformer, the first output terminal and the second output terminal of the autotransformer being DC coupled to input terminals of the frequency divider, wherein the first inductive element comprises a first flat conductive track having an interlaced coil shape, and the second and third inductive elements each comprises respective second and third flat conductive track each having a coil shape, the second and third conductive tracks being interlaced with each other and located on a periphery of the first inductive element.

11. The local oscillator device of claim 10, wherein a ratio of a width of the second and third conductive tracks over a width of the first conductive track is between 0.1 and 0.7.

12. The local oscillator device of claim 10, wherein the local oscillator device is implemented in an integrated manner within an integrated circuit, the integrated circuit comprising the autotransformer.

13. The local oscillator device of claim 12, wherein the frequency divider is implemented with Complementary Metal-Oxide-Semiconductor (CMOS) technology.

14. The local oscillator device of claim 10, wherein the first, second, and third conductive tracks are located in a first interconnection level of an integrated circuit.

15. A local oscillator device comprising:
an oscillator module having a first inductive element and a capacitive element coupled in parallel with the first inductive element;
a frequency divider coupled to the oscillator module and configured to deliver a local oscillator signal; and
an autotransformer comprising the first inductive element, a second inductive element, and a third inductive element, a first terminal of the second inductive element DC coupled to a first terminal of the first inductive element, a second terminal of the second inductive element being a first output terminal of the autotransformer, a first terminal of the third inductive element DC coupled to a second terminal of the first inductive element, a second terminal of the third inductive element being a second output terminal of the autotransformer, the first output terminal and the second output terminal of the autotransformer being DC coupled to input terminals of the frequency divider, wherein the frequency divider is configured to divide a frequency of an input signal at the first output terminal and the second output terminal of the autotransformer, wherein the oscillator module is configured to generate an oscillating signal with an amplitude below a threshold amplitude on terminals of the first inductive element, and the autotransformer is configured to generate the input signal with an amplitude above the threshold amplitude.

16. The local oscillator device of claim 15, wherein the threshold amplitude is greater than 1 V.

17. A transceiver system comprising:
an antenna configured to transmit and receive radio frequency signals,
a transmitting stage coupled to the antenna;
a receiving stage coupled to the antenna; and
a local oscillator device coupled to the transmitting stage and the receiving stage, the local oscillator device comprising:
an oscillator module having a resonator that comprises a first inductive element and a capacitive element coupled in parallel with the first inductive element;
a frequency divider coupled to the oscillator module and configured to generate a local oscillator signal; and
an autotransformer comprising the first inductive element, a second inductive element, and a third inductive element, a first terminal of the second inductive element DC coupled to a first terminal of the first inductive element, a second terminal of the second inductive element being a first output terminal of the autotransformer, a first terminal of the third inductive element DC coupled to a second terminal of the first inductive element, a second terminal of the third inductive element being a second output terminal of the autotransformer, the first output terminal and the second output terminal of the autotransformer being DC coupled to input terminals of the frequency divider.

18. The transceiver system of claim 17, wherein the transceiver system is implemented in a mobile phone.

19. The transceiver system of claim 17, wherein the transceiver system is implemented in a touch tablet.

20. The transceiver system of claim 17, wherein the receiver stage comprises:
   a low-noise amplifier;
   a mixer; and
   a balun transformer coupled between the low-noise amplifier and the mixer, the mixer configured to receive the local oscillator signal.

21. The transceiver system of claim 17, wherein the transmitting stage comprises:
   a power amplifier coupled to the antenna, the power amplifier configured to generate a transmission signal having a carrier frequency based on the local oscillator signal.

22. A method comprising:
   generating a first oscillating signal across a first inductive element, the first oscillating signal having a first amplitude, the first inductive element coupled in parallel with a capacitive element to form a resonator;
   generating a second oscillating signal with an autotransformer, the second oscillating signal having a second amplitude bigger than the first amplitude, wherein the autotransformer comprises the first inductive element, a second inductive element, and a third inductive element, a first terminal of the second inductive element DC coupled to a first terminal of the first inductive element, a second terminal of the second inductive element being a first output terminal of the autotransformer, a first terminal of the third inductive element DC coupled to a second terminal of the first inductive element, a second terminal of the third inductive element being a second output terminal of the autotransformer, the first output terminal and the second output terminal of the autotransformer being DC coupled to input terminals of a frequency divider; and
   generating a local oscillator signal with the frequency divider, the local oscillator signal having a frequency based on the second oscillating signal.

23. The method of claim 22, further comprising:
   supplying a first current with a current source to a sustaining amplifier, the sustaining amplifier coupled in parallel with the first inductive element; and
   compensating resistive losses with the sustaining amplifier to maintain oscillations of the first oscillating signal.

24. The method of claim 23, further comprising:
   controlling the first amplitude by adjusting the first current with an amplitude controller.

25. The method of claim 22, the first amplitude is 0.5 V.

* * * * *